(12) United States Patent
Regev et al.

(10) Patent No.: US 6,809,944 B2
(45) Date of Patent: Oct. 26, 2004

(54) CAM WITH AUTOMATIC NEXT FREE ADDRESS POINTER

(75) Inventors: Alon Regev, Woodland Hills, CA (US); Zvi Regev, West Hills, CA (US)

(73) Assignee: Micron Technology, Inc., Boise, ID (US)

(*) Notice: Subject to any disclaimer, the term of this patent is extended or adjusted under 35 U.S.C. 154(b) by 64 days.

(21) Appl. No.: 10/330,205

(22) Filed: Dec. 30, 2002

(65) Prior Publication Data

US 2004/0125630 A1 Jul. 1, 2004

(51) Int. Cl.$^7$ ............................................. G11C 15/00
(52) U.S. Cl. ..................... 365/49; 365/189.02; 365/194
(58) Field of Search ........................... 365/49, 189.02, 365/191, 194, 230.02

(56) References Cited

U.S. PATENT DOCUMENTS

| | | | | |
|---|---|---|---|---|
| 6,108,747 A | * | 8/2000 | Kaganoi | 711/108 |
| 6,693,814 B2 | * | 2/2004 | McKenzie et al. | 365/49 |
| 6,697,275 B1 | * | 2/2004 | Sywyk et al. | 365/49 |
| 6,718,433 B1 | * | 4/2004 | Pereira | 711/108 |

* cited by examiner

Primary Examiner—Van Thu Nguyen
Assistant Examiner—Hien Nguyen
(74) Attorney, Agent, or Firm—Dickstein Shapiro Morin & Oshinsky LLP

(57) ABSTRACT

A method and apparatus for automatically providing a Next Free Address (NFA) within a Content Addressable Memory (CAM) is disclosed. The NFA can be determined simultaneously with a search process using a priority encoder for indicating a highest priority storage location for a matching address, thereby expediting the NFA search.

71 Claims, 8 Drawing Sheets

CAM WITH AUTOMATIC NEXT FREE ADDRESS POINTER

FIELD OF THE INVENTION

The invention relates to Content Addressable Memories (CAMs) and a method and apparatus for automatically providing a Next Free Address (NFA) for a write operation.

BACKGROUND OF THE INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

A content addressable memory (CAM) is a memory device that accelerates any application requiring fast searches of a database, list, or pattern, such as in database machines, image or voice recognition, or computer and communication networks. CAMs provide benefits over other memory search algorithms by simultaneously comparing the desired information (i.e., data input to the device or in the comparand register) against the entire list of pre-stored entries. As a result of their unique searching algorithm, CAM devices are frequently employed in network equipment, particularly routers and switches, computer systems and other devices that require rapid content searching.

In order to perform a memory search in the above-identified manner, CAMs are organized differently than other memory devices (e.g., random access memory (RAM), dynamic RAM (DRAM), etc.). For example, data is stored in a RAM in a particular location, called an address. During a memory search on a RAM, the user supplies the address and gets back the data stored in that address (location).

In a CAM, however, data is stored in locations in a somewhat random fashion. The locations can be selected by an address, or the data can be written into a first empty memory location (also known as the NFA or Next Free Address). Once information is stored in a memory location, it is found doing a memory search by comparing every bit in any memory location with every bit of data in a comparand register circuit. When the content stored in the CAM memory location does not match the data placed in the comparand register, the local match detect circuit associated with the CAM memory location returns a no-match indication. When the content stored in the CAM memory location matches the data placed in the comparand register, the local match detect circuit associated with the CAM memory location returns a match indication. If one or more of the local match detect circuits return a match indication then the CAM device outputs a match indication. If no local match detect circuits return a match indication then the CAM device outputs a no-match indication. In addition, if a match is found then the CAM returns the identification of the address location in which the matching data is stored (or one of the address locations in which matching data was stored if more than one memory location contained matching data). Thus, with a CAM, the user supplies the data and gets back an indication of an address where a matching data is stored in the memory.

Data written into CAMs is often written to the first memory location that does not already contain valid data. This memory location is referred to as the Next Free Address (NFA), as mentioned previously. Since determining the NFA can be time-consuming, a CAM device which expedites the determination of an NFA is desired.

BRIEF SUMMARY OF THE INVENTION

In one aspect, the invention provides a content addressable memory, comprising a plurality of memory storage locations where each location has an associated indicator for indicating that the memory storage location is available for data storage, and an associated match line for indicating if a search word matches a word stored in the memory storage location. The invention also provides a first selector circuit for selecting one of the indicator and match line associated with each of the plurality of memory storage locations and applying it to a priority encoder; a next free address register coupled to the output of the priority encoder; and a match results register also coupled to the output of the priority encoder; where either the next free address register or the match results register is enabled to receive an address corresponding to the output of the priority encoder depending on the first selector circuit.

The invention also provides a priority encoder having a plurality of inputs and operable in a first mode where the first selection circuit respectively couples the match lines to the plurality of inputs to indicate a highest priority match on the match lines and in a second mode where the first selection circuit respectively couples the indicators to the plurality of inputs to indicate a highest priority storage location or NFA available for data storage.

BRIEF DESCRIPTION OF THE DRAWINGS

These and other aspects of the invention will be more clearly understood from the following detailed description which is provided in conjunction with the accompanying drawings.

DETAILED DESCRIPTION OF THE INVENTION

Figure 1:
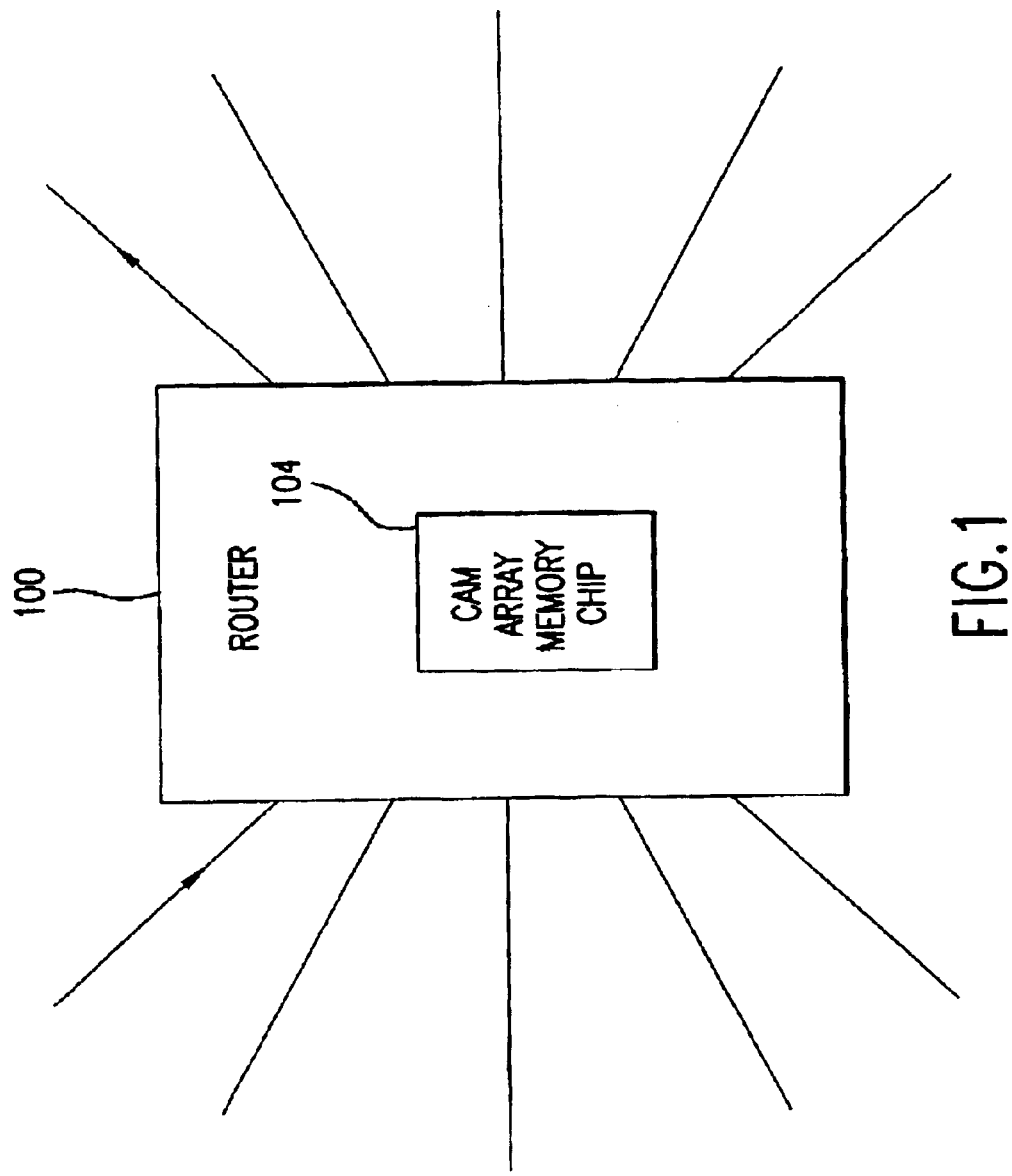
FIG. 1 depicts a simplified block diagram of a router employing a CAM array equipped with a multi-match circuit of the present invention.

FIG. 1 is a simplified block diagram of a router 100 connected to a CAM array memory chip 104 as may be used in a communications network, such as, e.g., part of the Internet backbone. The router 100 contains a plurality of input lines and a plurality of output lines. When data is transmitted from one location to another, it is sent in a form known as a packet. Oftentimes, prior to the packet reaching its final destination, that packet is first received by a router which decodes that part of the data identifying the ultimate destination and decides which output line and what forwarding instructions are required for the packet.

Generally, CAMs are very useful in router applications because of their ability for instantaneous search of a large database. As a result, when a packet is received by the router 100, the router already has a table of forwarding instructions for each ultimate destination stored within its CAM. Therefore, only that portion of the packet that identifies the sender and recipient need be decoded in order to perform a search of the CAM to identify which output line and instructions are required to pass the packet onto a next node of its journey.

In many applications where CAMs are used, the data stored in the CAM is acquired by a process of learning, wherein a specific data value is searched in the CAM, and if not found, the data is stored (or learned) in the CAM for later use. To store data in the CAM, the user must know which location (address) in the CAM is free, and thus may be written to. Writing data into the CAM typically requires a search for a free address, and a write operation performed to that free address. In the present invention the CAM automatically generates the Next Free Address (NFA) to which the new data is to be written and therefore if a search does not yield a match within the CAM, the next free address (NFA) is always present, and the data in the comparand register can be written automatically to that NFA.

Figure 2:
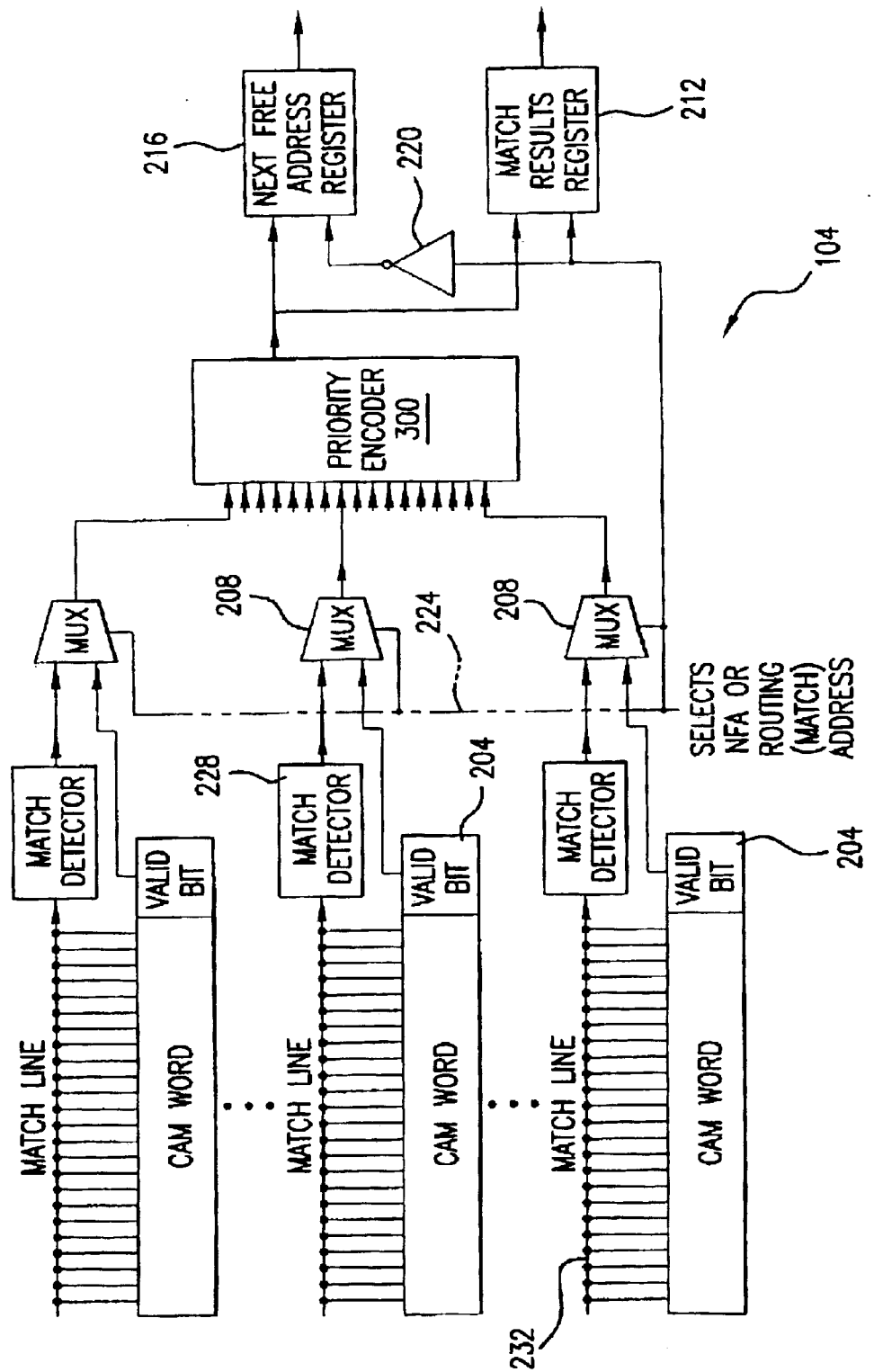
FIG. 2 shows a first embodiment of the invention.

A first embodiment of the CAM array 104 of the present invention is shown in FIG. 2. A plurality of CAM words each have an associated match detector 228 and an associated VALID bit 204 connected to respective inputs of a multiplexer 208. The multiplexers 208 are in turn controlled by a select line 224 and have outputs connected to a priority encoder 300. An NFA register 216 and a match results register 212 are connected to the output of the priority encoder 300. The select line 224 also controls which of the registers 212 or 216 are enabled, with the assistance of the inverter 220.

Within the CAM array 104, a search for a matching address requires two operational stages. In the first stage of the operation a search is conducted for a location or locations with data matching the data in a comparand register. Data in the comparand register is simultaneously compared, bit by bit, with the data stored in every word of the CAM 104. When a match of all the bits occurs of a specific word within the CAM 104, the match detector 228 associated with that word determines if a match has occurred or not and latches a "1" if a match has not been detected or "0" if a match has been detected. During any particular search, more than one match detector 228 can detect a match. This is because the comparand and/or the data words can contain "wild-card" or "don't-care" conditions.

In the second stage of operation the resulting match indicators output by the match detectors 228 are used by the priority encoder 300 to determine a highest priority location. Multiplexer 208 selects the match line as the input to the priority encoder. The priority encoder identifies the highest priority match location if any match was found. This location is stored in the match result register 212. If more than one match signal was "0", the priority encoder 300 identifies only one match location, otherwise known as the highest priority location.

It is possible that no match will be detected, so that the non-matching data word will need to be written (learned) within the CAM 104. The VALID bits 204 are always available for reading. Therefore, while the priority encoder 300 waits for the first stage of the data search to run its course, it can simultaneously search the VALID bits 204. Upon finding a memory location with a VALID bit 204 set to '0', meaning that no searchable data is present in the associated memory location, that memory location is considered to be available as an NFA. The VALID bit 204 with the highest priority is identified by priority encoder 300 and the address of the corresponding memory storage location is loaded into the NFA register 216.

Using this method, an NFA is available at the end of every data search without the need for a time-consuming, separate, non-concurrent search of the VALID bits 204. Thus, if no match is found, the writing of that data into an NFA can then occur without delay. Because the VALID bits 204 are always ready, while the match lines 232 require time to become valid, the priority encoder 300 can be time-domain multiplexed with respect to the NFA search and the highest priority match search. This multiplexing is controlled using the select line 224 in conjunction with the multiplexers 208 and the enable inputs to the match results register 212 and the next free address register 216. As shown in FIG. 2, the select line 224 determines whether the output of the match detectors 228 or the valid bits 204 for each of the memory storage locations are passed to the priority encoder 300. The select line 224 also determines whether the NFA or the match address is outputted by the priority encoder 300.

When operating in the match mode, the priority encoder 300 stores a match address in the match results register 212, and when operating in the NFA mode the priority encoder stores an NFA in the NFA register 216. When performing a learn operation, select line 224 is low to select an NFA search during the first operation. The result of this search is stored in register 216. During the second operation, select line 224 is high to select a highest priority match search. The result of this search is stored in register 212. The inverter 220 ensures that the two registers 212 and 216 are not simultaneously enabled.

Figure 3:
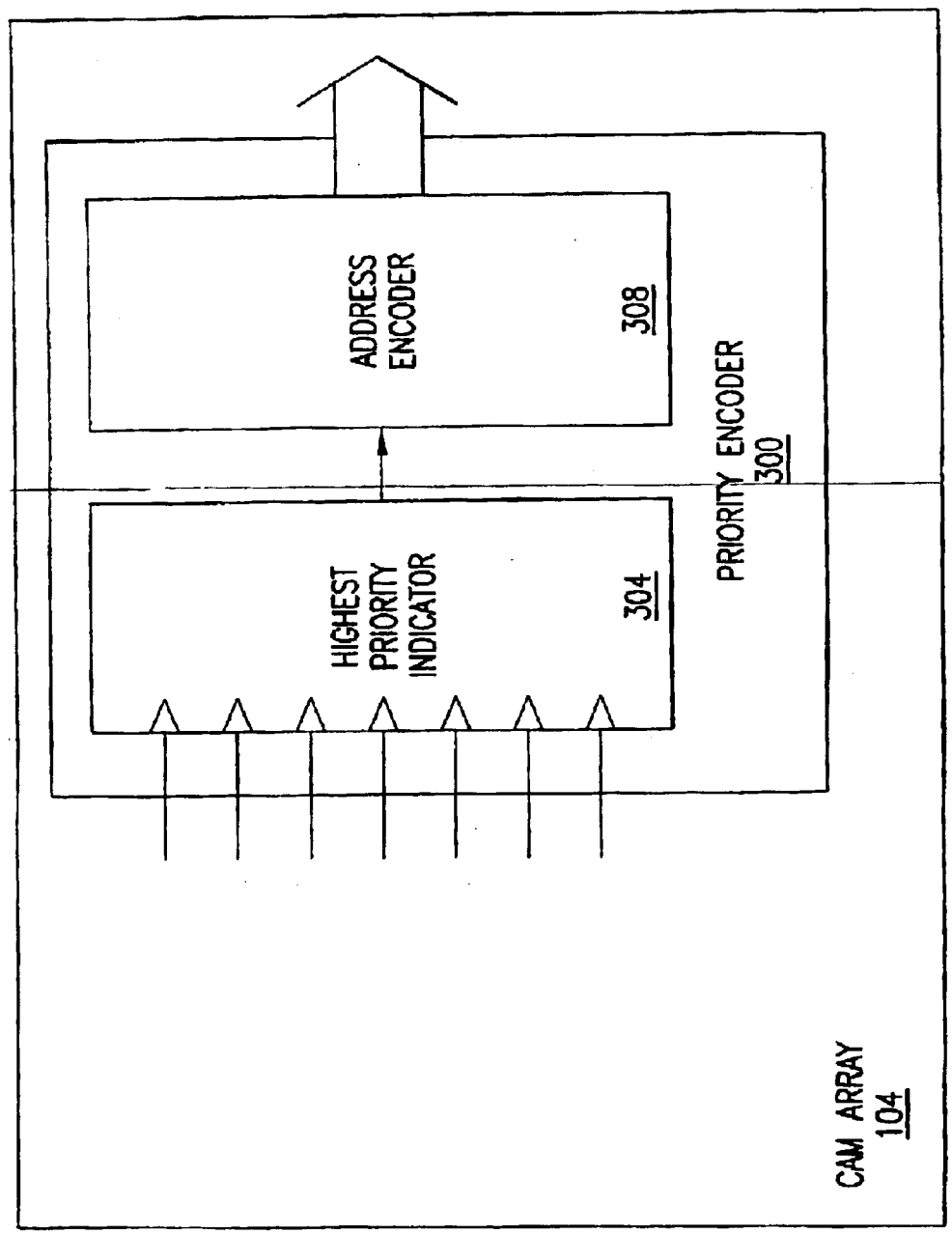
FIG. 3 is a block diagram of the priority encoder.

The priority encoder 300 of the present invention is comprised of two sections, as shown in FIG. 3. The highest priority indicator 304 is followed by the address encoder 308. Every memory location in the CAM array 104 has exactly one input into the highest priority indicator 304. Although many matches can occur during a CAM search, one purpose of the highest priority indicator 304 is to select a single memory location and provide that location to an address encoder 308. Thus, the highest priority indicator 304 will always indicate one and only one location within the CAM array 104 to the address encoder 308. The address encoder 308 then outputs the address of this location.

Figure 4:
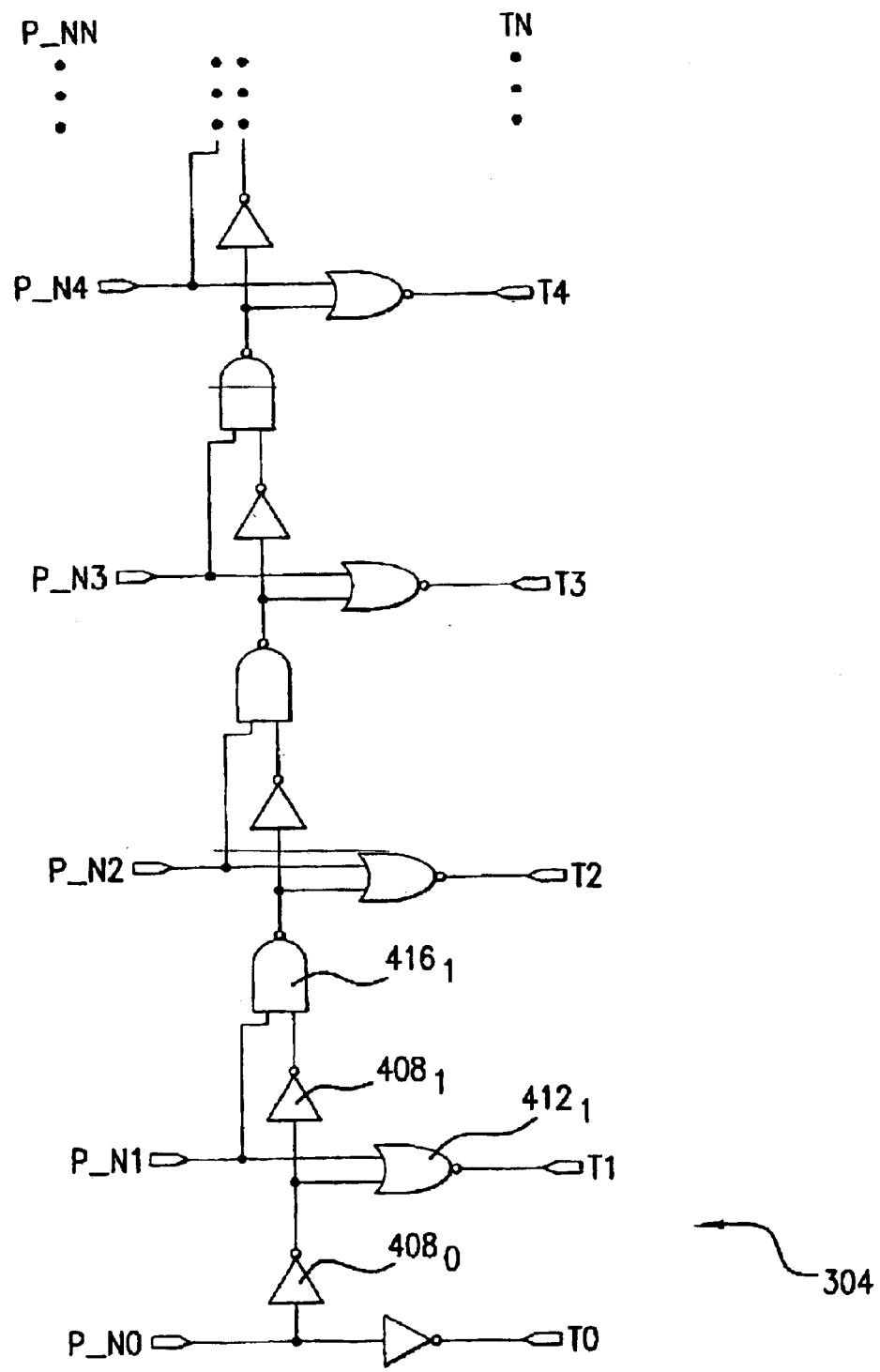
FIG. 4 is a schematic diagram of the highest priority indicator.

FIG. 4 shows an exemplary embodiment of the highest priority indicator (HPI) 304. The HPI operates as follows. In an initial state, all inputs P_N0 through P_NN are at a state of a "1" which is the inactive state, while all the outputs T0 through TN are in the inactive state of "0". Whenever any input P_N* goes to the active state of "0", the output associated with this input T* becomes active as well, and goes to the state of "1". An active input disables all the inputs above it in the chain, forcing their associated outputs to remain inactive ("0"). An active input on an input P_N0 will cause the output T1 of P_N1 to be inactive because of the inverter $408_0$ which feeds into the NOR gate $412_1$. Similarly, each succeeding output will be disabled partially by the NAND gates $416_{1-N}$.

Thus, the bottom of the highest priority indicator 304 has the highest priority, and the priority descends toward the top. Accordingly, input P_N0 will always have the highest priority over any other input. Therefore, if any number of inputs are simultaneously active, the highest priority indicator will activate only the output associated with the highest priority active input, leaving all other outputs inactive. Thus, the highest priority indicator 304 can be relied upon to consistently present one and only one location within the CAM 104 to the address encoder 308.

Figure 5:
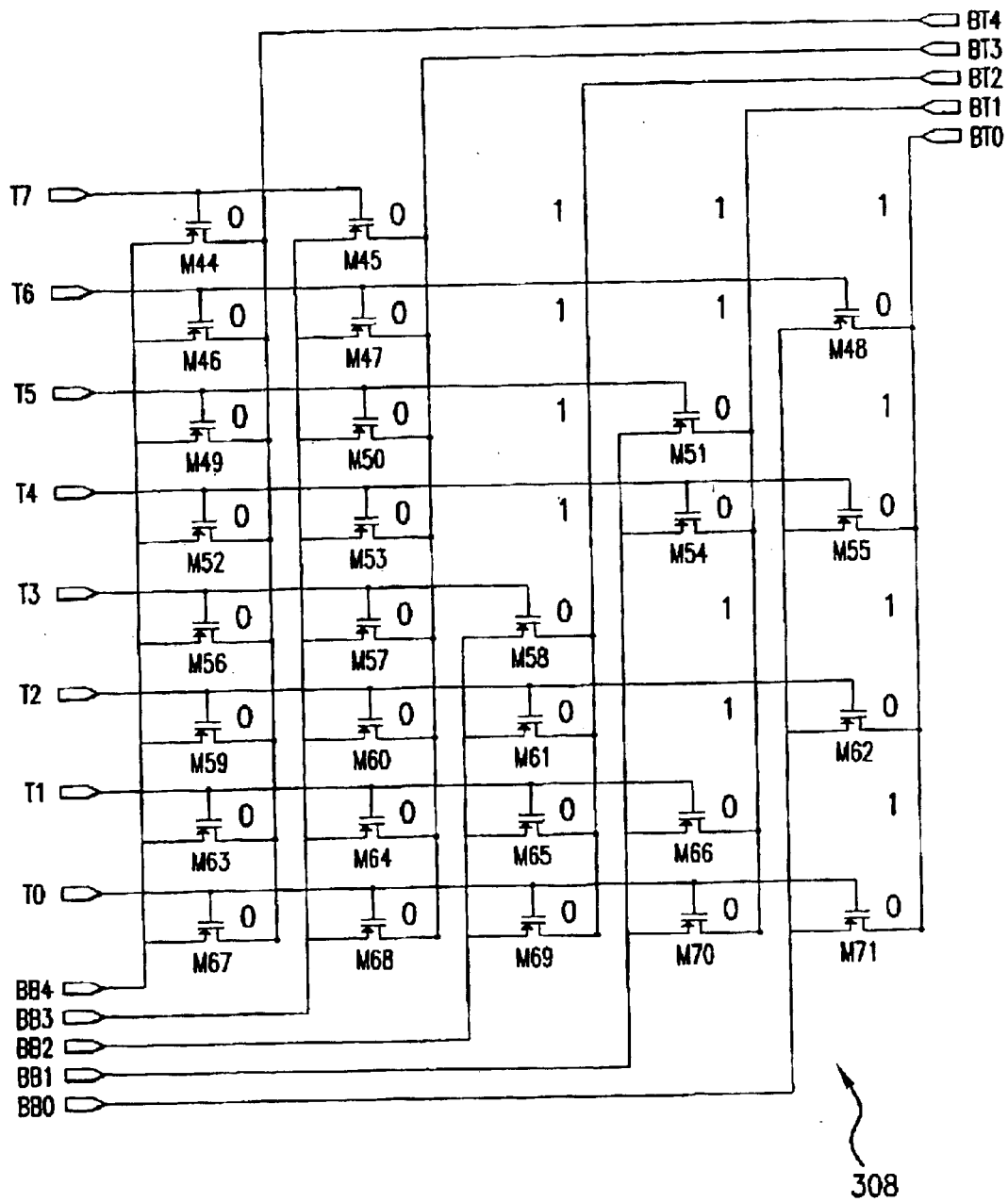
FIG. 5 is a schematic diagram of the address encoder.

Many methods could be used to convert the output of the highest priority indicator 304 into an address. The simplest method is that of a look-up table, although the present invention should not be limited only to that conversion method. FIG. 5 shows an 8 bit section of a 32 bit look-up table which comprises the address encoder 308 of the present invention. The inputs BB0 through BB4 are connected to ground, and the pins marked as BT0 through BT4 are each connected to the power supply via a separate resistor.

The operation of the address encoder 308 will now be explained using a simple example. T0–T7 will be enabled at any given time. Now assume that the input T0 is "1", turning ON all the transistors M67 through M71 connected thereto. The resulting current through the turned ON transistors causes the voltage at the output pins BT0 through BT4 to go down to zero volts, thus forming the binary output value of 00000. Now suppose instead the input T3 is active, transistors M56–58 would be enabled so that only the outputs BT2, BT3, and BT4 go to 0 volts, while BT0 and BT1 are pulled high. Thus the binary value 00011 would be present on the output pins BT0 through BT4.

The priority encoder 300 of the present invention could also be implemented in a hierarchical fashion out of many smaller priority encoders. For example, a 256 input priority encoder could be constructed out of 17 sixteen-input priority encoders. Each of sixteen inputs would go to one of sixteen priority encoders and the 17th input determines a priority among the first sixteen priority encoders. Each of the sixteen priority encoders could be further constructed using five four input priority encoders. The fifth priority encoder used to select from among the first four priority encoders.

Figure 6:
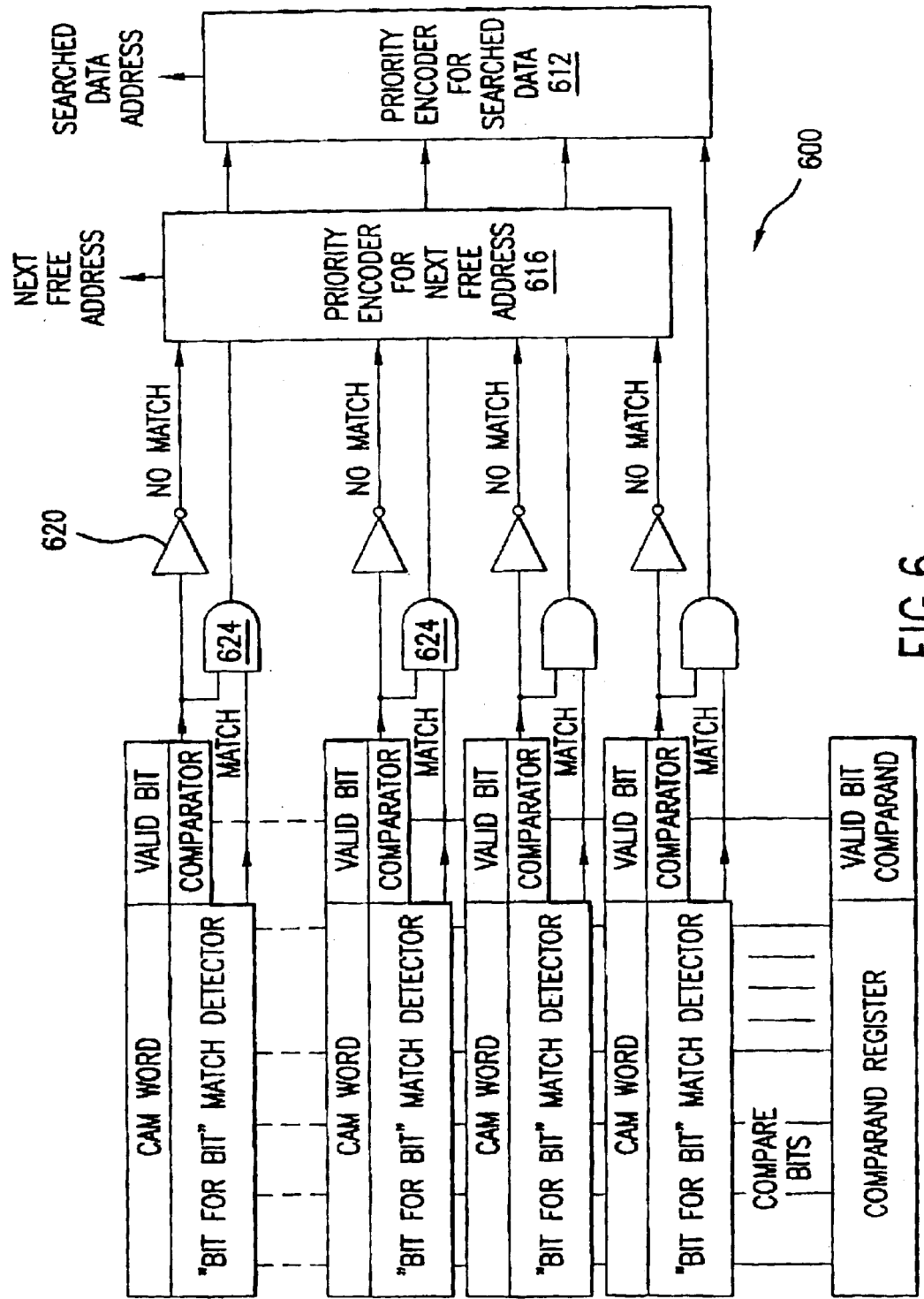
FIG. 6 shows a second embodiment of the invention.

FIG. 6 shows a second embodiment of the present invention. As with the first embodiment, the CAM array 600 has two operational modes. One detects a matching address, and the other determines an NFA. However, the CAM array 600 does not time-division multiplex one priority encoder, but instead utilizes two priority encoders 612 and 616. The priority encoder 612 receives match line inputs and outputs a matching address, while the priority encoder 616 receives VALID bit inputs and outputs an NFA. The AND gates 624 ensure that the input to the priority encoder 612 contains a valid match, while the inverters 620 ensure that the inputs to the priority encoder 616 arise from a "no match" condition rather than a "match" condition. Each of the priority encoders 612 and 616 may use the highest priority indicator 304 and address encoder 308 arranged as shown in FIGS. 3, 4, and 5.

Figure 7:
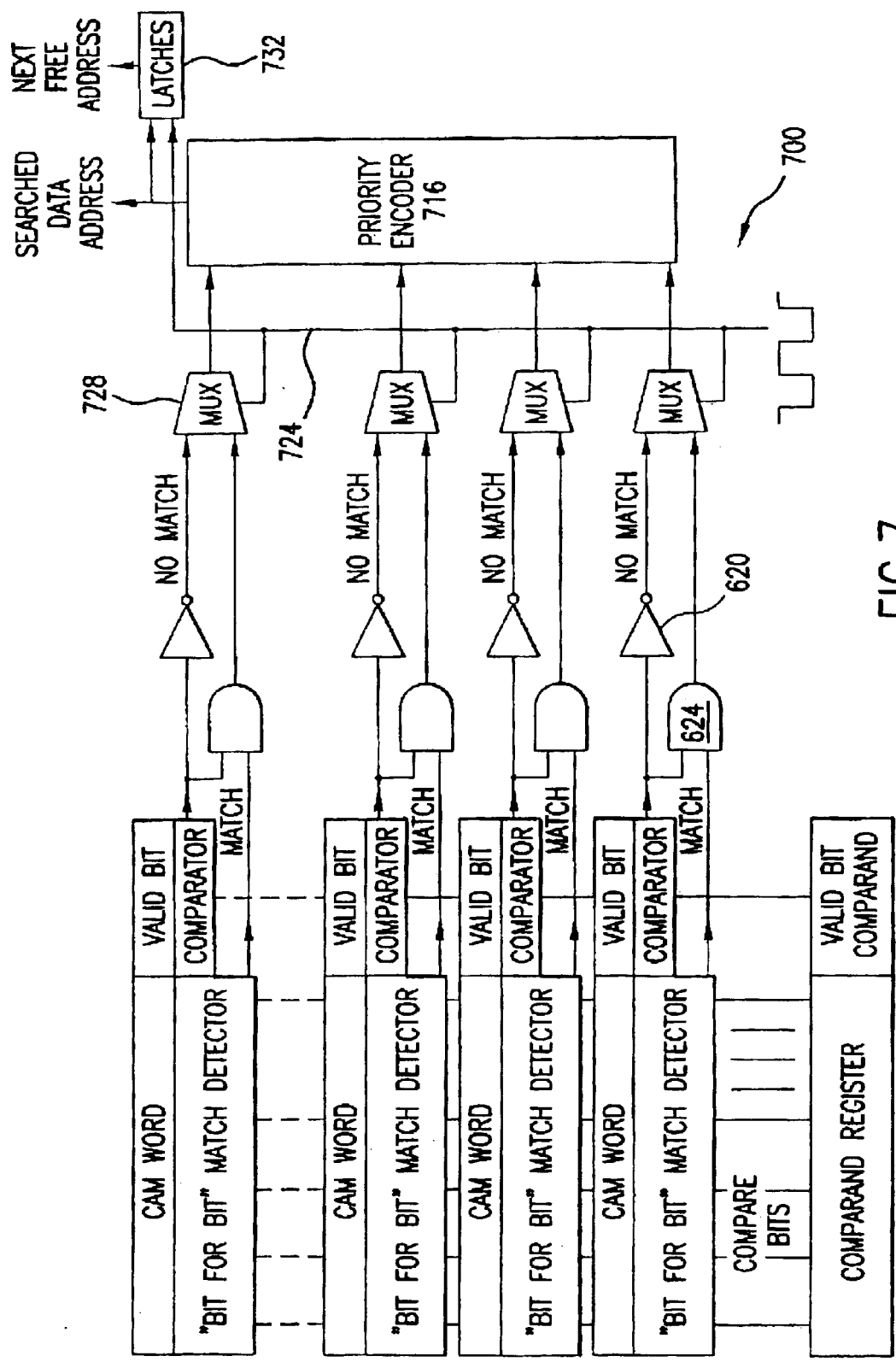
FIG. 7 shows a third embodiment of the invention.

FIG. 7 shows a third embodiment of the present invention, in which a CAM array 700 employs the AND gates 624 and inverters 620 as in the second embodiment. The CAM array 700 also performs two search operations, but does so with only one priority encoder 716. The CAM array 700 utilizes a select line 724 as in the first embodiment to select between using the priority encoder 716 to encode either a match address based on the output of an AND gate or an NFA address based on the status of the VALID bits 204. The select line 724 can be responsive to a clock signal or to some other selection mechanism. An NFA latch 732 stores an NFA for later use. Thus, the third embodiment combines features from both the first and the second embodiments.

Figure 8:
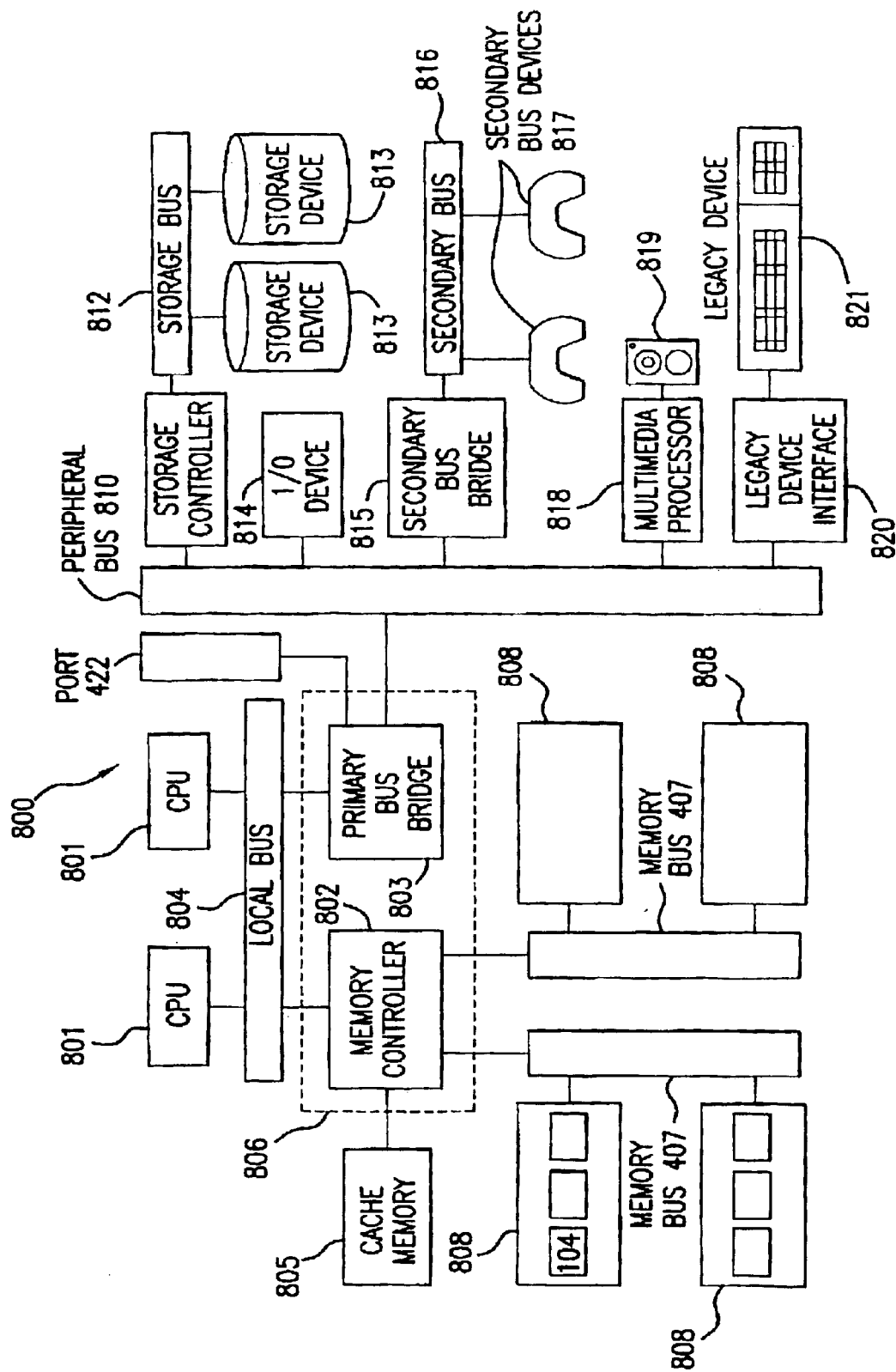
FIG. 8 shows use of a CAM in accordance with the present invention used within a processor system.

FIG. 8 illustrates an exemplary processing system 800 which utilizes the CAM arrays of the present invention. The processing system 800 includes one or more processors 801 coupled to a local bus 804. A memory controller 802 and a primary bus bridge 803 are also coupled the local bus 804. The processing system 800 may include multiple memory controllers 802 and/or multiple primary bus bridges 803. The memory controller 802 and the primary bus bridge 803 may be integrated as a single device 806.

The memory controller 802 is also coupled to one or more memory buses 807. Each memory bus accepts memory components 808. Any one of memory components 808 may contain a CAM array of the present invention. Although FIG. 8 shows CAM array 104 as exemplary, any of the other CAM arrays described herein, e.g. 600, 700, may also be used.

The memory components 808 may be a memory card or a memory module. The memory controller 802 may also be coupled to a cache memory 805. The cache memory 805 may be the only cache memory in the processing system. Alternatively, other devices, for example, processors 801 may also include cache memories, which may form a cache hierarchy with cache memory 805. If the processing system 800 include peripherals or controllers which are bus masters or which support direct memory access (DMA), the memory controller 802 may implement a cache coherency protocol. If the memory controller 802 is coupled to a plurality of memory buses 807, each memory bus 807 may be operated in parallel, or different address ranges may be mapped to different memory buses 807.

The primary bus bridge 803 is coupled to at least one peripheral bus 810. Various devices, such as peripherals or additional bus bridges may be coupled to the peripheral bus 810. These devices may include a storage controller 811, an miscellaneous I/O device 814, a secondary bus bridge 815, a multimedia processor 818, and an legacy device interface 820. The primary bus bridge 803 may also coupled to one or more special purpose high speed ports 822. In a personal computer, for example, the special purpose port might be the Accelerated Graphics Port (AGP), used to couple a high performance video card to the processing system 800.

The storage controller 811 couples one or more storage devices 813, via a storage bus 812, to the peripheral bus 810. For example, the storage controller 811 may be a SCSI controller and storage devices 813 may be SCSI discs. The I/O device 814 may be any sort of peripheral. For example, the I/O device 814 may be an local area network interface, such as an Ethernet card. The secondary bus bridge may be used to interface additional devices via another bus to the processing system. For example, the secondary bus bridge may be an universal serial port (USB) controller used to couple USB devices 817 via to the processing system 800. The multimedia processor 818 may be a sound card, a video capture card, or any other type of media interface, which may also be coupled to one additional devices such as speakers 819. The legacy device interface 820 is used to couple legacy devices, for example, older styled keyboards and mice, to the processing system 800.

The processing system 800 illustrated in FIG. 8 is only an exemplary processing system with which the invention may be used. While FIG. 8 illustrates a processing architecture especially suitable for a general purpose computer, such as a personal computer or a workstation, it should be recognized that well known modifications can be made to configure the processing system 800 to become more suitable for use in a variety of applications. For example, many electronic devices which require processing may be implemented using a simpler architecture which relies on a CPU 801 coupled to memory components 808 and/or memory devices 809. The modifications may include, for example, elimination of unnecessary components, addition of specialized devices or circuits, and/or integration of a plurality of devices.

While the invention has been described and illustrated with reference to specific exemplary embodiments, it should be understood that many modifications and substitutions can be made without departing from the spirit and scope of the invention. According, the invention is not to be considered as limited by the foregoing description but is only limited by the scope of the appended claims.

What is claimed is:

1. A content addressable memory, comprising:
   a plurality of memory storage locations, each having an associated indicator for indicating that the memory storage location is available for data storage and an associated match line for indicating if a search word matches a word stored in the memory storage location;
   a first selection circuit for selecting one of the indicators and match lines associated with said plurality of memory storage locations; and
   a priority encoder circuit having a plurality of inputs coupled to received signals from said selected indicators and match lines, said priority encoder being operable in a first mode where said first selection circuit respectively couples said match lines to said plurality of inputs to indicate a priority match on said match lines and in a second mode where said first selection circuit respectively couples said indicators to said plurality of inputs to indicate a priority storage location available for data storage.

2. The content addressable memory of claim 1, wherein said priority storage location is a highest priority storage location.

3. The content addressable memory of claim 1, further comprising:
   a next free address register coupled to the output of said priority encoding circuit, wherein said next free address register is enabled depending on said first selection circuit.

4. The content addressable memory of claim 1, further comprising:
   a match results register coupled to the output of said priority encoder for storing a match address when said priority encoder operates in said first mode.

5. The content addressable memory as in claim 1, wherein said priority encoder circuit comprises a highest priority indicator circuit having said plurality of inputs and a plurality of outputs, one of said outputs being active at a time to indicate a highest priority of signals present at said inputs.

6. The content addressable memory of claim 1, wherein said indicator is a stored bit.

7. The content addressable memory of claim 5, wherein said priority encoder circuit further comprises an address encoder for indicating an address associated with a highest priority output of said highest priority indicator circuit.

8. The content addressable memory of claim 7, wherein said address encoder further comprises a lookup table.

9. The content addressable memory of claim 1 wherein said priority encoding circuit is time domain multiplexed between said first and second modes.

10. A method of operating a content addressable memory array, comprising:
    searching said array for a match with the contents of a comparand;
    searching predetermined bits of said array for invalid bits indicating storage locations which can be used for word storage;
    determining which if any of said matches have a highest priority according to a predetermine priority scheme;
    storing the address of said match, if any, in a match results register;
    determining which, if any, of said invalid bits have a highest priority according to a predetermined priority scheme; and
    storing the address of said storage locations associated with the highest priority invalid bit in a next free address register.

11. The method of claim 10, further comprising:
    selectively enabling either said next free address register or said match results register for address storage.

12. The method of claim 10, wherein said searching of said predetermined bits occurs while said array is searched for a match with the contents of said comparand.

13. A router, comprising:
    a plurality of message receiving inputs;
    a plurality of message transmitting outputs; and
    a semiconductor chip containing a content addressable memory, said content addressable memory being used to route messages on said inputs to said outputs, said content addressable memory comprising:
       a plurality of memory storage locations, each having an associated indicator for indicating that the memory storage location is available for data storage and an associated match line for indicating if a search word matches a word stored in the memory storage location;
       a first selection circuit for selecting one of the indicators and match lines associated with said plurality of memory storage locations; and
       a priority encoder circuit having a plurality of inputs coupled to received signals from said selected indicators and match lines, said priority encoder being operable in a first mode where said first selection circuit respectively couples said match lines to said plurality of inputs to indicate a priority match on said match lines and in a second mode where said first selection circuit respectively couples said indicators to said plurality of inputs to indicate a priority storage location available for data storage.

14. The router of claim 13, wherein said priority storage location is a highest priority storage location.

15. The router of claim 13, further comprising:
    a next free address register coupled to the output of said priority encoding circuit, wherein said next free address register is enabled depending on said first selection circuit.

16. The router of claim 13, further comprising:
    a match results register coupled to the output of said priority encoder for storing a match address when said priority encoder operates in said first mode.

17. The router as in claim 13, wherein said priority encoder comprises a highest priority indicator circuit having said plurality of inputs and a plurality of outputs, one of said outputs being active at a time to indicate a highest priority of signals present at said inputs.

18. The router of claim 13, wherein said indicator is a stored bit.

19. The router of claim 17, wherein said priority encoder circuit further comprises an address encoder for indicating an address associated with a highest priority output of said highest priority indicator circuit.

20. The router of claim 19, wherein said address encoder further comprises a lookup table.

21. The router of claim 13 wherein said priority encoding circuit is time domain multiplexed between said first and second modes.

22. A processor circuit, comprising
a processor; and
a content-addressable memory circuit for exchanging data with said processor; said processor circuit comprising:
  a plurality of memory storage locations, each having an associated indicator for indicating that the memory storage location is available for data storage and an associated match line for indicating if a search word matches a word stored in the memory storage location;
  a first selection circuit for selecting one of the indicators and match lines associated with said plurality of memory storage locations; and
  a priority encoder circuit having a plurality of inputs coupled to received signals from said indicators and match lines, said priority encoder being operable in a first mode where said first selection circuit respectively couples said match lines to said plurality of inputs to indicate a highest priority match on said match lines and in a second mode where said first selection circuit respectively couples said indicators to said plurality of inputs to indicate a highest priority storage location available for data storage.

23. The processor circuit of claim 22, wherein said priority storage location is a highest priority storage location.

24. The processor circuit of claim 22, further comprising:
a next free address register coupled to the output of said priority encoding circuit, wherein said next free address register is enabled depending on said first selection circuit.

25. The processor circuit of claim 22, further comprising:
a match results register coupled to the output of said priority encoder for storing a match address when said priority encoder operates in said first mode.

26. The processor circuit as in claim 22, wherein said priority encoder comprises a highest priority indicator circuit having said plurality of inputs and a plurality of outputs, one of said outputs being active at a time to indicate a highest priority of signals present at said inputs.

27. The processor circuit of claim 22, wherein said indicator is a stored bit.

28. The processor circuit of claim 26, wherein said priority encoder circuit further comprises an address encoder for indicating an address associated with a highest priority output of said highest priority indicator circuit.

29. The processor circuit of claim 28, wherein said address encoder further comprises a lookup table.

30. The processor circuit of claim 24 wherein said priority encoding circuit is time domain multiplexed between said first and second modes.

31. A content addressable memory, comprising:
a plurality of memory storage locations, each having an associated indicator for indicating that the memory storage location is available for data storage and an associated match line for indicating if a search word matches a word stored in the memory storage location;
a first priority encoder having a plurality of inputs coupled to receive signals from said match lines and to indicate a priority match on said match lines; and
a second priority encoder having a plurality of inputs coupled to receive said indicator and operable to indicate a priority storage location available for data storage.

32. The content addressable memory as in claim 31, wherein said first and second priority encoders comprise a highest priority indicator circuit having said plurality of inputs and a plurality of outputs, one of said outputs being active at a time to indicate a highest priority of signals present at said inputs.

33. The content addressable memory of claim 31, wherein said indicator is a stored bit.

34. The content addressable memory of claim 32, wherein said first and second priority encoder circuits each further comprise an address encoder for indicating an address associated with a highest priority output of said highest priority indicator circuit.

35. The content addressable memory of claim 34, wherein said address encoder further comprises a lookup table.

36. The content addressable memory of claim 31, wherein said search for available storage locations occurs concurrently with the search for a match.

37. A method of operating a content addressable memory array, comprising:
searching said array for a match with the contents of a comparand;
searching predetermined bits of said array for invalid bits indicating storage locations which can be used for data storage;
determining in a first priority encoder which if any of said matches have a highest priority according to a predetermine priority scheme;
outputting the address of said match if any;
determining in a second priority encoder which if any of said invalid bits have a highest priority according to a predetermined priority scheme; and
outputting the address of a storage location corresponding to a highest priority invalid bit.

38. The method of claim 37, wherein said search for available storage locations occurs concurrently with the search for a match.

39. A router, comprising:
a plurality of message receiving inputs;
a plurality of message transmitting outputs; and
a semiconductor chip containing a content addressable memory, said content addressable memory being used to route messages on said inputs to said outputs, said content addressable memory comprising:
  a plurality of memory storage locations, each having an associated indicator for indicating that the memory storage location is available for data storage and an associated match line for indicating if a search word matches a word stored in the memory storage location;
  a first priority encoder having a plurality of inputs coupled to receive signals from said match lines and to indicate a priority match on said match lines; and
  a second priority encoder having a plurality of inputs coupled to receive said indicator and operable to indicate a priority storage location available for data storage.

40. The router as in claim 39, wherein said first and second priority encoders comprise a highest priority indicator circuit having said plurality of inputs and a plurality of outputs, one of said outputs being active at a time to indicate a highest priority of signals present at said inputs.

41. The router of claim 39, wherein said indicator is a stored bit.

42. The router of claim 40, wherein said first and second priority encoder circuits each further comprise an address encoder for indicating an address associated with a highest priority output of said highest priority indicator circuit.

43. The router of claim 42, wherein said address encoder further comprises a lookup table.

44. The router of claim 39, wherein said search for available storage locations occurs concurrently with the search for a match.

45. A processor circuit, comprising
a processor; and
a content-addressable memory circuit for exchanging data with said processor, said memory circuit comprising:
   a plurality of memory storage locations, each having an associated indicator for indicating that the memory storage location is available for data storage and an associated match line for indicating if a search word matches a word stored in the memory storage location;
   a first priority encoder having a plurality of inputs coupled to receive signals from said match lines and to indicate a priority match on said match lines; and
   a second priority encoder having a plurality of inputs coupled to receive said indicator and operable to indicate a priority storage location available for data storage.

46. The processor circuit as in claim 45, wherein said first and second priority encoders comprise a highest priority indicator circuit having said plurality of inputs and a plurality of outputs, one of said outputs being active at a time to indicate a highest priority of signals present at said inputs.

47. The processor circuit of claim 45, wherein said indicator is a stored bit.

48. The processor circuit of claim 46, wherein said first and second priority encoder circuits each further comprise an address encoder for indicating an address associated with a highest priority output of said highest priority indicator circuit.

49. The processor circuit of claim 46, wherein said address encoder further comprises a lookup table.

50. The processor circuit of claim 45, wherein said search for available storage locations occurs concurrently with the search for a match.

51. A content addressable memory, comprising:
   a plurality of memory storage locations, each having an associated indicator for indicating that the memory storage location is available for data storage and an associated match line for indicating if a search word matches a word stored in the memory storage location;
   a first selection circuit for selecting one of the indicator and match line associated with each of said plurality of memory storage locations;
   a priority encoder having a plurality of inputs and operable in a first mode where said first selection circuit respectively couples said match lines to said plurality of inputs to indicate a highest priority match on said match lines and in a second mode where said first selection circuit respectively couples said indicators to said plurality of inputs to indicate a highest priority storage location available for data storage; and
   a selectively operable register coupled to the output of said priority encoder; said selectively operable register being enabled and disabled by said first selection circuit.

52. The content addressable memory as in claim 51, wherein said priority encoder comprises a highest priority indicator circuit having said plurality of inputs and a plurality of outputs, one of said outputs being active at a time to indicate a highest priority of signals present at said inputs.

53. The content addressable memory of claim 51, wherein said indicator is a stored bit.

54. The content addressable memory of claim 51, wherein said priority encoder circuit further comprises an address encoder for indicating an address associated with a highest priority output of said highest priority indicator circuit.

55. The content addressable memory of claim 54, wherein said address encoder further comprises a lookup table.

56. The content addressable memory of claim 51 wherein said priority encoding circuit is time domain multiplexed between said first and second modes.

57. A method of operating a content addressable memory array, comprising:
   searching words of said array for a match with the contents of a comparand;
   searching predetermined bits associated with said words of said array for invalid bits indicating available storage locations;
   determining which if any of said matches have a highest priority according to a predetermine priority scheme;
   outputting the address of said match if any;
   determining which if any of said invalid bits have a highest priority according to a predetermined priority scheme; and
   storing the address of a storage location corresponding to a highest priority invalid bit if no match exists in a next free address register.

58. The method of claim 57, further comprising:
   selectively enabling said next free address register to store said address of said storage location.

59. The method of claim 57, wherein said search of said predetermined bits occurs simultaneously with said search for words of said array which match said comparand.

60. A router, comprising:
   a plurality of message receiving inputs;
   a plurality of message transmitting outputs; and
   a semiconductor chip containing a content addressable memory, said content addressable memory being used to route messages on said inputs to said outputs, said content addressable memory comprising:
      a plurality of memory storage locations, each having an associated indicator for indicating that the memory storage location is available for data storage and an associated match line for indicating if a search word matches a word stored in the memory storage location;
      a priority encoder having a plurality of inputs and operable in a first mode where a first selection circuit respectively couples said match lines to said plurality of inputs to indicate a highest priority match on said match lines and in a second mode where said first selection circuit respectively couples said indicators to said plurality of inputs to indicate a highest priority storage location available for data storage; and
      a selectively operable register for storing an address of a memory location corresponding to a highest priority storage location available for data storage.

61. The router as in claim 60, wherein said priority encoder comprises a highest priority indicator circuit having said plurality of inputs and a plurality of outputs, one of said outputs being active at a time to indicate a highest priority of signals present at said inputs.

62. The router of claim 60, wherein said indicator is a stored bit.

63. The router of claim 60, wherein said priority encoder circuit further comprises an address encoder for indicating an address associated with a highest priority output of said highest priority indicator circuit.

64. The router of claim 63, wherein said address encoder further comprises a lookup table.

65. The router of claim 60, wherein said priority encoding circuit is time domain multiplexed between said first and second modes.

66. A processor circuit, comprising a processor; and a content-addressable memory circuit for exchanging data with said processor, said memory circuit comprising:

a plurality of memory storage locations, each having an associated indicator for indicating that the memory storage location is available for data storage and an associated match line for indicating if a search word matches a word stored in the memory storage location;

a first selection circuit for selecting one of the indicator and match line associated with each of said plurality of memory storage locations;

a priority encoder having a plurality of inputs and operable in a first mode where said first selection circuit respectively couples said match lines to said plurality of inputs to indicate a highest priority match on said match lines and in a second mode where said first selection circuit respectively couples said indicators to said plurality of inputs to indicate a highest priority storage location available for data storage; and a selectively operable register for storing an address of a memory location corresponding to a highest priority storage location available for data storage.

67. The content addressable memory as in claim 66, wherein said priority encoder comprises a highest priority indicator circuit having said plurality of inputs and a plurality of outputs, one of said outputs being active at a time to indicate a highest priority of signals present at said inputs.

68. The content addressable memory of claim 66, wherein said indicator is a stored bit.

69. The content addressable memory of claim 66, wherein said priority encoder circuit further comprises an address encoder for indicating an address associated with a highest priority output of said highest priority indicator circuit.

70. The processor circuit of claim 69, wherein said address encoder further comprises a lookup table.

71. The processor circuit of claim 66 wherein said priority encoding circuit is time domain multiplexed between said first and second modes.

* * * * *

UNITED STATES PATENT AND TRADEMARK OFFICE
CERTIFICATE OF CORRECTION

PATENT NO. : 6,809,944 B2
DATED : October 26, 2004
INVENTOR(S) : Alon Regev and Zvi Regev It is certified that error appears in the above-identified patent and that said Letters Patent is hereby corrected as shown below:

Column 6,
Line 21, "include" should read -- includes --
Lines 32, 34, 45 and 49, "an" should read -- a --
Line 35, "also coupled" should read -- also be coupled --
Line 53, "one additional devices such as" should read -- one of such additional devices as --

Column 10,
Lines 27-28, "predetermine" should read -- predetermined --

Column 12,
Line 21, "predetermine" should read -- predetermined --

Signed and Sealed this

Twenty-second Day of March, 2005

JON W. DUDAS
*Director of the United States Patent and Trademark Office*